United States Patent
Hausmann

[11] Patent Number: 6,104,596
[45] Date of Patent: *Aug. 15, 2000

[54] APPARATUS FOR RETAINING A SUBTRATE IN A SEMICONDUCTOR WAFER PROCESSING SYSTEM AND A METHOD OF FABRICATING SAME

[75] Inventor: Gilbert Hausmann, Santa Clara, Calif.

[73] Assignee: Applied Materials, Inc., Santa Clara, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 09/063,764

[22] Filed: Apr. 21, 1998

[51] Int. Cl.[7] .................................................. H02N 13/00
[52] U.S. Cl. ........................................ 361/234; 279/128
[58] Field of Search .................... 361/233–235; 279/128

[56] References Cited

U.S. PATENT DOCUMENTS

| | | | |
|---|---|---|---|
| 4,645,218 | 2/1987 | Ooshio et al. | 361/234 |
| 4,665,468 | 5/1987 | Dohya | 361/414 |
| 4,771,730 | 9/1988 | Tezuka | 118/723 |
| 5,117,121 | 5/1992 | Watanabe et al. | 307/130 |
| 5,250,137 | 10/1993 | Arami et al. | 156/345 |
| 5,255,153 | 10/1993 | Nozawa et al. | 361/234 |
| 5,275,683 | 1/1994 | Arami et al. | 156/345 |
| 5,382,469 | 1/1995 | Kubota et al. | 428/332 |
| 5,413,360 | 5/1995 | Atari et al. | 279/128 |
| 5,460,684 | 10/1995 | Saeki et al. | 156/345 |
| 5,539,179 | 7/1996 | Nozawa et al. | 219/121.43 |
| 5,625,526 | 4/1997 | Watanabe et al. | 361/234 |
| 5,691,876 | 11/1997 | Chen et al. | 361/234 |
| 5,753,132 | 5/1998 | Shamouilian et al. | 361/234 |
| 5,781,400 | 7/1998 | Takahashi et al. | 361/234 |
| 5,801,915 | 9/1998 | Kholodenko et al. | 361/234 |
| 5,822,171 | 10/1998 | Shamouilian et al. | 361/234 |
| 5,886,863 | 3/1999 | Nagasaki et al. | 361/234 |

FOREIGN PATENT DOCUMENTS

| | | | |
|---|---|---|---|
| 0452 222 A1 | 10/1991 | European Pat. Off. | H01L 21/00 |
| 0 707 339 A2 | 4/1996 | European Pat. Off. | H01L 21/321 |
| 60-261377 | 12/1985 | Japan | H02N 13/00 |
| 6263552 | 9/1994 | Japan | C04B 37/00 |
| 9045757 | 2/1997 | Japan | H01L 21/68 |

OTHER PUBLICATIONS

GPI WEB CLIENT Abstract of Substrate Holder, JP403003249A, Tanabe et al., appl No. JP 01136866, Jan. 1991.

*Primary Examiner*—Ronald W. Leja
*Attorney, Agent, or Firm*—Thomason, Moser & Patterson

[57] ABSTRACT

An electrostatic chuck including a body of ceramic and a metal backing portion for mounting the chuck directly to a metal pedestal and a process of manufacturing the electrostatic chuck using sintering. The electrostatic chuck contains a metal backing portion having at least one hole extending therethrough and the body of ceramic includes at least one portion extending through the hole.

17 Claims, 2 Drawing Sheets

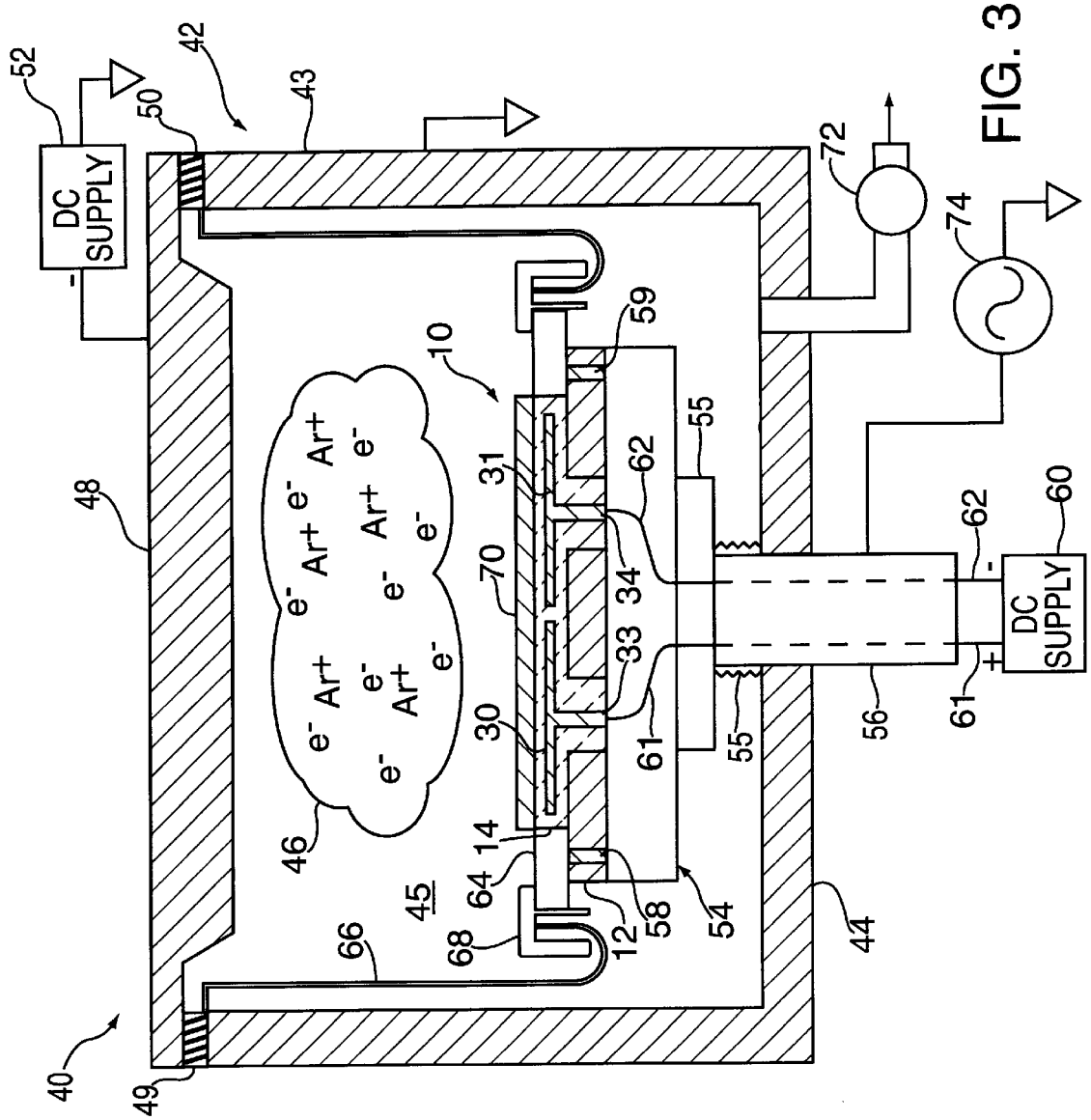

APPARATUS FOR RETAINING A SUBTRATE IN A SEMICONDUCTOR WAFER PROCESSING SYSTEM AND A METHOD OF FABRICATING SAME

BACKGROUND OF THE DISCLOSURE

1. Field of the Invention

This invention relates to semiconductor wafer processing systems and, more particularly, to an electrostatic chuck for retaining a substrate within such systems.

2. Description of the Background Art

Electrostatic chucks are known to the art for electrostatically attracting and retaining a substrate, such as a semiconductor wafer, during processing such as in a physical vapor deposition (PVD) processing system, chemical vapor deposition (CVD) processing system and etching system.

An embodiment of such an electrostatic chuck is disclosed in U.S. Pat. No. 5,117,121, entitled METHOD OF AND APPARATUS FOR APPLYING VOLTAGE TO ELECTROSTATIC CHUCK, patented May 26, 1992, Toshiya Watanabe et al. inventors. This patent is incorporated herein by reference. An electrostatic chuck generally includes a sheet or block of dielectric material, e.g., alumina-titanium oxide compound, aluminum-nitride, polyimide and the like, having a pair of electrodes embedded in the dielectric material. When a voltage is applied between the electrodes, the substrate is electrostatically attracted to the electrostatic chuck according to the Johnsen-Rahbek effect or Coulombic effect.

To electrostatically retain a wafer in a vacuum chamber of a semiconductor wafer processing system, the ceramic body of the electrostatic chuck is mounted directly, such as by bolts, to a metal pedestal which typically is made of stainless steel. The ceramic body and the metal pedestal have different coefficients of expansion, and since the ceramic body and metal pedestal experience thermal excursions during semiconductor wafer processing, the ceramic body and metal pedestal expand differentially, and such differential thermal expansion coupled with the direct mounting of the ceramic body to the metal pedestal can result in ceramic breakage with the attendant loss of a relatively expensive ceramic electrostatic chuck, and more significantly and more expensively, can result in the ruination of a partially processed semiconductor wafer residing on the ceramic electrostatic chuck during breakage.

Further, in many semiconductor wafer processing systems that utilize plasma enhanced processing, the pedestal itself is biased with an RF signal such that a wafer supported by the pedestal is biased with respect to the plasma in the chamber. To effectively bias a wafer, the RF energy is coupled through the electrostatic chuck to the wafer that is retained thereupon. By coupling the RF energy from the pedestal through the electrostatic chuck, some of the RF energy is dissipated by the ceramic and the chucking electrodes. To enhance the amount of RF energy coupled to the wafer, it is desirable to apply the RF power to an RF electrode that is very near to the wafer rather than apply the power to the pedestal. As such, high current capacity electrodes that are embedded in the ceramic body are needed. This can be accomplished by embedding relatively large, thick electrodes, i.e., electrodes having high current carrying capacity, and relatively large feedthroughs into the ceramic body of the electrostatic chuck to carry the RF power. However, such an electrostatic chuck assembly can result in unwanted heating of the ceramic body by the RF currents. Such heating also may result in ceramic breakage. To moderate the thermal gradients within the chuck and avoid ceramic breakage, the ceramic body is made relatively thick. However, by making the ceramic thicker, more RF energy is dissipated in the ceramic and any advantages gained by applying RF energy to an RF electrode in the chuck rather than the pedestal are lost.

Accordingly, there is a need in the art for an electrostatic chuck having a relatively thin body of ceramic, an RF bias electrode positioned relatively near the wafer and a body of ceramic which is not mounted directly to a metal pedestal.

SUMMARY OF THE INVENTION

The disadvantages associated with the prior art are overcome by an electrostatic chuck embodying the present invention. Such an electrostatic chuck may include a body of ceramic containing chucking electrodes, where the ceramic body is mounted to a metal backing portion that forms an RF bias electrode. The entire assemblage of the ceramic body, chucking electrodes and metal backing portion is fabricated using a single sintering step. The metal backing portion is designed to be mounted directly to a metal pedestal. The metal backing portion has at least one hole extending therethrough and the body of ceramic includes at least one portion extending through the hole. At least one metal electrode is embedded in the body of ceramic and spaced from the metal backing portion and at least one metal feedthrough is formed integrally with the metal electrode and is embedded in and extends through the portion of the body of ceramic extending through the hole in the metal backing portion.

The process of the present invention for manufacturing the electrostatic chuck of the present invention may include the steps of simultaneously sintering a body of ceramic powder to form the ceramic body and sintering bodies of metal powder to form the metal backing portion and to integrally form the metal electrode and metal feedthrough. The ceramic powder and metal powder are chosen to have substantially the same coefficient of expansion and the ceramic and metal powders are sintered simultaneously under relatively high heat and pressure to cause bonding at the grain boundary between the materials. This bonding mounts the body of ceramic to the metal backing portion across the entire interface between these portions and embeds the metal electrodes and metal feedthroughs in the body of ceramic. As such, a unitary electrostatic chuck is fabricated.

Substrate processing apparatus, such as PVD semiconductor wafer processing apparatus, CVD semiconductor wafer processing apparatus, ion implating apparatus and semiconductor wafer etching apparatus, utilizing the electrostatic chuck of the present invention benefit from an electrostatic chuck that can be affixed to a pedestal by conventional bolts or other fasteners and clamps. Since the metal backing portion of the chuck is affixed to a metal pedestal, the coefficients of expansion of the metal components are similar and chuck breakage due to thermal differential is avoided. Additionally, the metal backing portion can be biased to form an RF bias electrode that is a uniform distance from the wafer. In this manner, the ceramic does not have to be thick to dissipate the heat generated by the RF electrode and, consequently, the ceramic can be relatively thin. As such, this electrode (the backing portion) is also relatively near to the wafer to efficiently couple RF energy thereto and, since the integral RF electrode is not embedded into the ceramic, the RF current flowing through the backing plate does not heat the ceramic to any significant degree.

BRIEF DESCRIPTION OF THE DRAWINGS

The teachings of the present invention can be readily understood by considering the following detailed description in conjunction with the accompanying drawings, in which:

FIG. 3 depicts a diagrammatical, generally vertical cross-sectional, view of a PVD semiconductor wafer processing apparatus utilizing the electrostatic chuck of the present invention.

To facilitate understanding, identical reference numerals have been used, where possible, to designate identical elements that are common to the figures.

DETAILED DESCRIPTION

Figure 1:
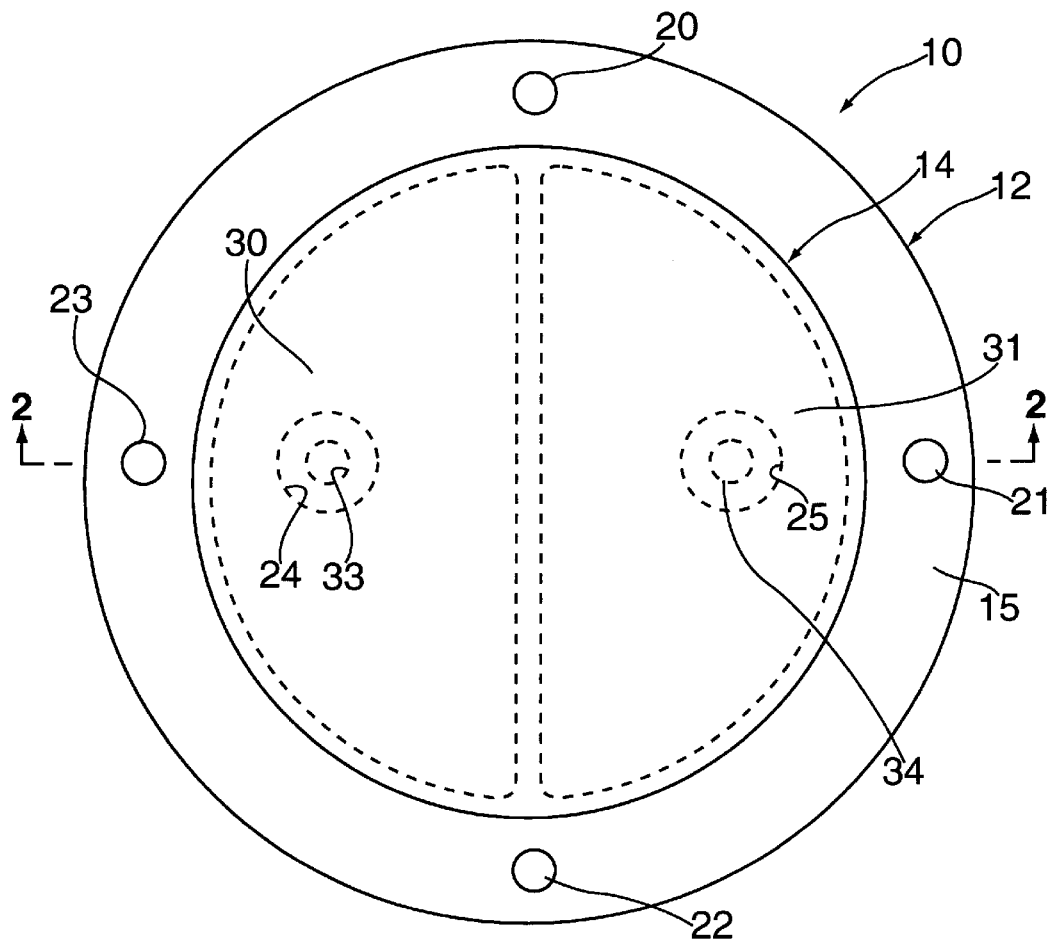
FIG. 1 depicts a top plan view of an electrostatic chuck embodying the present invention.
Figure 2:
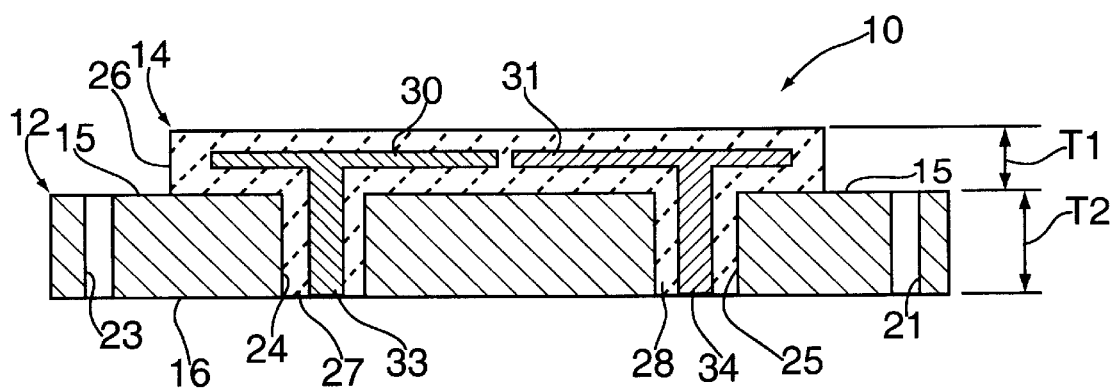
FIG. 2 depicts an elevational cross-sectional view taken generally along the line 2—2 in FIG. 1 in the direction of the arrows.

FIGS. 1 and 2, depict an electrostatic chuck 10 embodying the present invention. The electrostatic chuck 10 includes a portion or layer of electrically conductive material that is referred to herein as a metal backing portion 12 (or backing plate) and a body or layer of relatively low resistivity material such as the body 14 of ceramic material. The body 14 of ceramic material is mounted to the metal backing portion 12 in a manner described in detail below. The metal backing portion 12 is a generally disc-shaped metal body including a top 15 and a bottom 16 and has a plurality of mounting holes, e.g., four holes 20, 21, 22 and 23 extending therethrough. The holes 20–23 are for receiving threaded members, such as bolts, for mounting the metal backing portion 12, and thereby the electrostatic chuck 10, to a metal pedestal as described below and shown in FIG. 3. The metal backing portion 12 also contains a pair of holes 24 and 25 extending therethrough from the top 15 to the bottom 16. The body 14 of ceramic material includes a generally disc-shaped upper portion 26 and two integrally formed and perpendicularly downwardly extending generally hollow cylindrical members or portions 27 and 28.

The electrostatic chuck 10 includes a pair of generally half-moon shaped metal electrodes 30 and 31 embedded in the upper portion 26 of the body of ceramic material and two generally solid cylindrical metal feedthroughs 33 and 34 formed integrally, respectively, with the metal electrodes 30 and 31 and extending downwardly therefrom and concentrically through the generally hollow cylindrical portions 27 and 28 of the body 14 of ceramic material. From FIG. 2, it will be noted that portions of the metal feedthroughs 33 and 34 are embedded in the upper portion 26 of the ceramic body 14 and a portion of the metal feedthroughs are embedded in the hollow cylindrical portions 27 and 28 of the ceramic body 14.

The electrostatic chuck 10 in accordance with the manufacturing process of the present invention is an all-sintered one-piece detachable electrostatic chuck which, as taught below and illustrated in FIG. 3, is also an RF biasable electrostatic chuck.

It will be generally understood that in accordance with the manufacturing process of the present invention the electrostatic chuck 10 may be made by sintering metallic powder to form the metal backing portion 12, metal electrodes 30 and 31, and metal feedthroughs 33 and 34 and by simultaneously sintering ceramic powder to form the body 14 of ceramic material. To prevent differential thermal expansion between the metal backing portion 12 and ceramic body 14, the metal powder and ceramic powder for sintering are chosen to have substantially the same coefficient of expansion. For example, the metal powder may be molybdenum having a coefficient of expansion of about $5.2 \times 10^{-6}/K°$ and the ceramic powder may be aluminum-nitride having a coefficient of expansion of about $4.4 \times 10^{-6}/K°$. In a manner known to those skilled in the sintering art, the molybdenum powder and aluminum-nitride powder are placed in suitable molds so as to give the metal backing portion 12 and body 14 of ceramic material the component elements and shapes shown in FIGS. 1 and 2 and described above. The molybdenum powder and aluminum-nitride powder, as noted, are sintered simultaneously at a temperature of about 1200° C. and at a pressure of about 10–100 Bar. This sintering process produces bonding at the grain boundary of the sintering powders to create bonds between the sintered molybdenum and the sintered aluminum-nitride. This "mounts" the body 14 of ceramic material to the metal backing portion 12 across the entire interface between the ceramic portion and the backing portion.

Although an all sintered electrostatic chuck is preferable, one alternative embodiment contains solid electrodes and respective feedthroughs that are inserted into the ceramic powder before sintering the ceramic body and metal backing portion. The pre-formed electrodes are fabricated of thin plates of molybdenum. An alternative to the solid electrode plates are electrodes formed of a metal mesh. Such thin plates or mesh do not cause excessive physical stress upon the ceramic of the chuck during thermal cycling.

The metal backing portion 12 has a thickness of about 12 mm and the ceramic body 14 has a thickness of about 3 mm. The ceramic body 14 generally is generally thinner than the metal backing portion 12. The thinness of the ceramic body 14, as compared to prior art electrostatic chucks typically including a ceramic body having a thickness of about 12 to 25 mm, substantially eliminates RF power losses as RF energy is coupled through the ceramic to the wafer. A prior art chuck having an embedded RF electrode must have a thick ceramic to dissipate the heat generated by the embedded electrode and reduce the thermal gradient across the chuck or ceramic breakage may result. Since the present invention bonds the backing portion that forms the RF electrode to the back of the ceramic, the ceramic does not experience substantial heating from RF currents flowing through the RF electrode. Additionally, when mounted to a metal pedestal, the metal pedestal forms a heat sink that will moderate the temperature of the chuck ceramic. As such, the ceramic portion of the present invention is significantly thinner than the ceramic portion of prior art chucks.

FIG. 3 depicts a cross-sectional schematic view of a PVD semiconductor wafer processing system 40 containing the electrostatic chuck 10 of the present invention. It should be understood that the present invention is not limited to PVD systems but may also be embodied in CVD and etching apparatus or other apparatus which can advantageously use the electrostatic chuck of the present invention. Apparatus 40 includes a generally hollow, generally cylindrical enclosure chamber 42 including a generally cylindrical wall 43 and an integrally formed bottom 44 defining an internal deposition chamber 45. The chamber contains an ionizable gas such as, for example, argon. A target 48 of deposition material, e.g., titanium, is suitably mounted to the top of the enclosure 42 by suitable insulative mounting members 49 and 50. A negative DC voltage supply 52 is connected between the target 48 and the cylindrical wall 43 by connecting the voltage supply 52 and cylindrical wall 43 to ground. The negative DC voltage supply 52 establishes an electric field between the target 48 and the grounded portions of the chamber. The electric field ionizes the argon gas 46 producing positively charged argon ions Ar+. A suitable metal pedestal 54 includes a metal base 55 is suitably mounted at the bottom of the enclosure 42 in a manner known to the art. A hollow metal tube 56 is mounted to the pedestal base 55. The metal base 55 and metal tube 56 may be made, for example, of stainless steel.

The electrostatic chuck 10 of the present invention is mounted to the metal pedestal 54 by mounting the metal backing portion 12 directly to the metal pedestal 54 by suitable threaded members or bolts 58 and 59. The metal backing portion could alternatively be peripherally clamped to the metal base 54. A suitable DC supply 60 is provided and leads 61 and 62 extend from the DC voltage supply 60 through the hollow metal tube 56 and through the pedestal 54 to the metal feedthroughs 33 and 34. A suitable annular deposition ring 64 is placed over the top 15, also note FIG. 2, of the peripheral portion of the metal backing portion 12 extending peripherally outwardly from the body 14 of ceramic material. A suitable generally annular deposition shield 66 is provided and is connected to the inner top portion of the enclosure 42 and to the deposition ring 64 by shadow ring 68. The deposition ring 64, shield 66 and shadow ring 68, as known to the art, prevent unwanted deposition of the deposition material on the inside of the cylindrical wall 43, metal backing portion 12, and body 14 of ceramic material.

In this embodiment, a semiconductor wafer 70 is placed on the electrostatic chuck 10 by lowering the pedestal 54 and positioning the wafer onto the chuck via a slit valve (not shown) located in the side of the chamber. The pedestal is then raised into the processing position shown in FIG. 3 and, upon DC voltage from the supply 60 being applied to the metal feedthroughs 33 and 34, and thereby to the metal electrodes 30 and 31, the semiconductor wafer 70 is electrostatically attracted to and retained by the electrostatic chuck 10 in accordance with the Johnsen-Rahbek effect as taught in the Watanabe patent incorporated hereinabove. A suitable exhaust pump 72 is provided for exhausting or evacuating the deposition chamber 45. A suitable RF power supply 74 is provided and is connected between the cylindrical tube 56 and ground. As such, RF power is coupled to the metal tube 56, to the metal pedestal 54 and to the metal backing portion 12 of the electrostatic chuck 10. Accordingly, it will be understood that the electrostatic chuck 10 is an RF biasable electrostatic chuck.

In operation, the DC supply 52 establishes the above-noted electric field to ionize the argon 46 to produce the positively charged argon ions Ar+ and the positively charged argon ions are attracted to the negatively biased target 48. The ions and strike the target 48 removing portions thereof which are deposited on the top surface of the semiconductor wafer 70. The RF supply 74 supplies the above-noted RF bias to the electrostatic chuck 10 and the semiconductor wafer 70. The RF bias enhances plasma and deposition efficiency as is well known in the art.

In brief summary, some advantages of the electrostatic chuck 10 of the present invention are that the ceramic body 14 is sufficiently thin to reduce RF power dissipation and reduce the electrical impedance driven by the RF power supply, that mounting of electrostatic chuck 10 to the metal pedestal 54 (FIG. 3) is through the metal layer 12 and not through the ceramic body 14 which substantially overcomes differential thermal expansion between the ceramic body and the metal pedestal, that sintering the metal body or layer 12 and the layer or ceramic body 14 respectively from metal powder and ceramic powder having sufficiently the same coefficient of expansion substantially eliminates differential expansion between the metal layer 12 and ceramic layer 14 and thereby substantially eliminates cracking of the layer of ceramic 14.

Although the foregoing embodiment of the invention referred to an electrostatic chuck having a pair of half-moon shaped electrodes, the shape and number of the disclosed electrodes is not intended to be a limitation on the invention. The electrodes may be of any shape or size and can number from a single electrode as used in a monopolar electrostatic chuck up to many electrodes as in an electrostatic chuck used for zonal chucking of a wafer.

It will be understood that many variations and modifications may be made in the present invention without departing from the spirit and the scope thereof.

What is claimed is:

1. Apparatus for retaining a substrate such as a semiconductor wafer, comprising:

a body of electrically conductive material;

a body of low resistivity material, a first portion of said body of low resistivity material overlying at least a portion of said body of electrically conductive material, and at least a second portion of said body of low resistivity material extending through said body of electrically conductive material;

at least one electrode residing in said first portion of said body of low resistivity material and spaced from said body of electrically conductive material;

a metal feedthrough having a first portion extending through a portion of said first portion of said low resistivity material and a second portion of said metal feedthrough extending through said second portion of said low resistivity material, and said metal feedthrough spaced from said body of electrically conductive material, wherein said body of electrically conductive material, said body of low resistivity material, said at least one electrode and said metal feedthrough are simultaneously sintered into a unitary body.

2. The apparatus according to claim 1 wherein said body of electrically conductive material is a body of sintered first metal, wherein said body of low resistivity material is a body of sintered ceramic, wherein said electrode is a body of sintered second metal, wherein said metal feedthrough is a body of sintered third metal, and wherein said sintered ceramic and said sintered metals have substantially the same coefficient of expansion.

3. The apparatus according to claim 2 wherein said first, second and third metals are bodies of sintered molybdenum and wherein said body of sintered ceramic is a body of sintered aluminum-nitride.

4. The apparatus according to claim 1 wherein said body of electrically conductive material is a body of sintered first metal, wherein said body of low resistivity material is a body of sintered ceramic, and wherein said sintered ceramic and said sintered metal have substantially the same coefficient of expansion.

5. The apparatus of claim 1 wherein said electrode is a metal plate or metal mesh.

6. An electrostatic chuck for electrostatically attracting a semiconductor wafer, comprising:

a metal body including a top and a bottom and having at least one hole extending therethrough from said top to said bottom and perpendicular thereto;

a body of ceramic material including an upper portion overlying at least a portion of said metal body and further including at least one perpendicularly downwardly extending generally hollow cylindrical portion extending downwardly through said hole formed in said metal body;

at least one electrode embedded in said upper portion of said body of ceramic material and spaced from said metal body; and at least one metal feedthrough extending perpendicularly downwardly from said electrode and embedded partially in said upper portion of said body of ceramic material and embedded partially in and extending downwardly concentrically through said hollow cylindrical portion of said body of ceramic material and spaced from said metal body, wherein said metal body, said body of ceramic material, said at least one electrode and said metal feedthrough are simultaneously sintered into a unitary body.

7. The electrostatic chuck according to claim 6 wherein said metal body has at least two holes extending therethrough from said top to said bottom and perpendicular thereto, wherein said body of ceramic material includes at least two integrally formed and perpendicularly downwardly extending generally hollow cylindrical portions extending downwardly respectively through said holes formed in said metal body, wherein said at least one electrode comprises at least two electrodes embedded in said upper portion of said body of ceramic material and spaced from said metal body, wherein said at least one metal feedthrough comprises at least two metal feedthroughs formed respectively integrally with and extending perpendicularly downwardly from said electrodes and extending downwardly concentrically respectively through said hollow cylindrical portions of said body of ceramic material and spaced from said metal body; and wherein said at least two feedthroughs are for connecting said at least two electrodes to a chucking voltage source.

8. The electrostatic chuck according to claim 6 wherein said metal body is a body of sintered first metal, wherein said body of ceramic material is a body of sintered ceramic material, wherein said electrode is a body of sintered second metal, wherein said metal feedthrough is a body of sintered third metal and wherein said sintered first metal and sintered ceramic, said sintered second metal and said sintered third metal have substantially the same coefficient of expansion.

9. The electrostatic chuck according to claim 8 wherein said first, second and third metals are molybdenum and wherein said ceramic material is aluminum-nitride.

10. The electrostatic chuck according to claim 8 wherein said metal body has a first thickness, wherein said upper portion of said body of ceramic material has a second thickness and wherein said second thickness is smaller than said first thickness.

11. The electrostatic chuck according to claim 10 wherein said first thickness is about 12 mm and wherein said second thickness is about 3 mm.

12. An electrostatic chuck for being mounted to a metal pedestal and for electrostatically attracting a substrate, such as a semiconductor wafer, during substrate processing, comprising:

a body of ceramic and a metal backing, said metal backing for being mounted to the metal pedestal, said metal backing having at least one hole extending therethrough and said body of ceramic including at least one portion extending through said hole;

at least one metal electrode embedded in said body of ceramic and spaced from said metal backing; and at least one metal feedthrough embedded in and extending through said one portion of said body of ceramic extending through said hole, wherein said metal backing, said body of ceramic, said at least one electrode and said metal feedthrough are simultaneously sintered into a unitary body.

13. The electrostatic chuck according to claim 12 wherein said metal backing has at least two holes extending therethrough, wherein said body of ceramic has at least two portions extending through said two holes, wherein said at least one metal electrode comprises at least two metal electrodes embedded in said body of ceramic and spaced from said metal backing, and wherein said at least one metal feedthrough includes at least two metal feedthroughs formed integrally respectively with said at least two metal electrodes and said at least two metal feedthroughs extending respectively through said at least two portions of said ceramic body extending through said holes.

14. The electrostatic chuck according to claim 12 wherein said body of ceramic is a body of sintered ceramic, wherein said metal backing is a body of sintered first metal, wherein said at least one metal electrode and said at least one metal feedthrough are an integrally formed body of sintered second metal, said sintered ceramic, said sintered first metal and said sintered second metal having substantially the same coefficient of expansion and are sintered simultaneously at a temperature of about 122 degrees C and at a pressure of about 10 to 100 Bar to bond said sintered ceramic to said sintered first metal and said sintered second metal.

15. The electrostatic chuck according to claim 14 wherein said sintered ceramic is sintered aluminum-nitride and wherein said sintered first and second metals are sintered molybdenum.

16. The electrostatic chuck according to claim 12 wherein said metal backing is connected to an RF power supply and said body of ceramic has a thickness that is sufficiently thin to substantially reduce RF losses.

17. The electrostatic chuck according to claim 16 wherein said body of ceramic has a thickness of about 3 mm and wherein said metal backing has a thickness of about 12 mm.

* * * * *